United States Patent
Cao et al.

(10) Patent No.: US 10,276,626 B2
(45) Date of Patent: *Apr. 30, 2019

(54) THREE-DIMENSIONAL INTEGRATED MULTISPECTRAL IMAGING SENSOR

(71) Applicant: INTERNATIONAL BUSINESS MACHINES CORPORATION, Armonk, NY (US)

(72) Inventors: Qing Cao, Westchester, NY (US); Shu-Jen Han, Cortlandt Manor, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/857,086

(22) Filed: Dec. 28, 2017

(65) Prior Publication Data

US 2018/0145109 A1    May 24, 2018

Related U.S. Application Data

(63) Continuation of application No. 14/802,014, filed on Jul. 17, 2015, now Pat. No. 9,881,966.

(51) Int. Cl.
  *H01L 27/146* (2006.01)
  *H01L 31/032* (2006.01)
  *H01L 31/0296* (2006.01)

(52) U.S. Cl.
  CPC .. *H01L 27/14652* (2013.01); *H01L 27/14636* (2013.01); *H01L 27/14647* (2013.01); *H01L 27/14696* (2013.01); *H01L 31/0296* (2013.01); *H01L 31/032* (2013.01)

(58) Field of Classification Search
  CPC ......... H01L 27/14652; H01L 27/14636; H01L 27/14669; H01L 27/14696; H01L 31/0296; H01L 31/032
  See application file for complete search history.

(56) References Cited

U.S. PATENT DOCUMENTS

| | | | |
|---|---|---|---|
| 4,956,686 A | 9/1990 | Borrello et al. | |
| 5,185,648 A | 2/1993 | Baker et al. | |
| 5,373,182 A | * 12/1994 | Norton | ................ H01L 27/1446 257/440 |
| 6,469,358 B1 | 10/2002 | Martin | |

(Continued)

OTHER PUBLICATIONS

Byrne, P. et al., "High-Performance Thin-Film Transistors from Solution-Processed Cadmium Selenide and a Self-Assembled Multilayer Gate Dielectric," Advanced Materials, vol. 20, No. 12, 2008, pp. 2319-2324.

(Continued)

*Primary Examiner* — Christine S. Kim
(74) *Attorney, Agent, or Firm* — Tutunjian & Bitetto, P.C.; Vazken Alexanian

(57) ABSTRACT

A three-dimensional multispectral imaging sensor and method for forming a three-dimensional multispectral imaging sensor are provided. The three-dimensional multispectral imaging sensor includes a monolithic structure having a plurality of layers. Each of the layers is formed from light detecting materials for detecting light of respective different non-overlapping wavelengths and having respective different bandgaps.

19 Claims, 12 Drawing Sheets

(56) References Cited

U.S. PATENT DOCUMENTS

| | | | |
|---|---|---|---|
| 7,196,790 B2 | 3/2007 | Cole | |
| 8,203,155 B2 | 6/2012 | Wang et al. | |
| 2007/0034777 A1* | 2/2007 | Tuckerman | H01L 27/14618 250/208.1 |
| 2008/0178924 A1 | 7/2008 | Kempa et al. | |
| 2009/0200589 A1* | 8/2009 | Qian | H01L 27/14603 257/292 |
| 2013/0089237 A1 | 4/2013 | Sargent et al. | |

OTHER PUBLICATIONS

Mitzi, D. et al., "High-mobility ultrathin semiconducting films prepared by spin coating," Nature, vol. 428, No. 6980, Mar. 2004, pp. 299-303.

Shimoda et al., "Solution-processed silicon films and transistors," Nature, vol. 440, No. 7085, Apr. 2006, pp. 783-786.

Talapin et al., "PbSe nanocrystal solids for n-and p-channel thin film field-effect transistors," Science, vol. 310, No. 5745, Oct. 2005, pp. 86-89.

List of IBM Patents or Patent Applications Treated as Related dated Dec. 28, 2017, 2 pages.

* cited by examiner

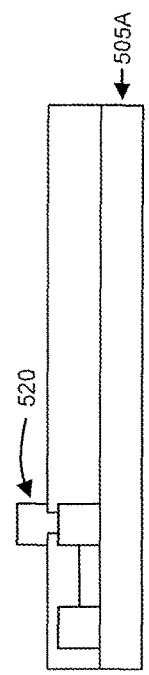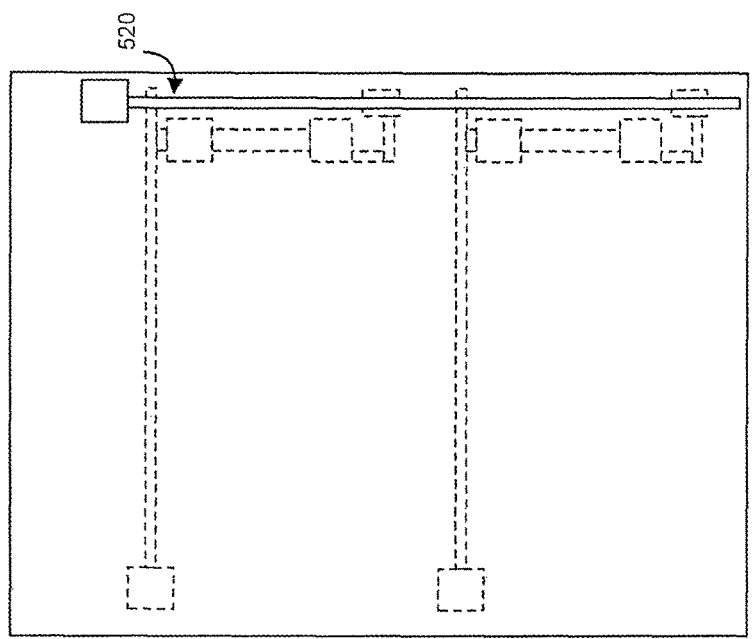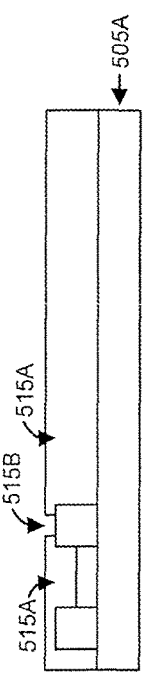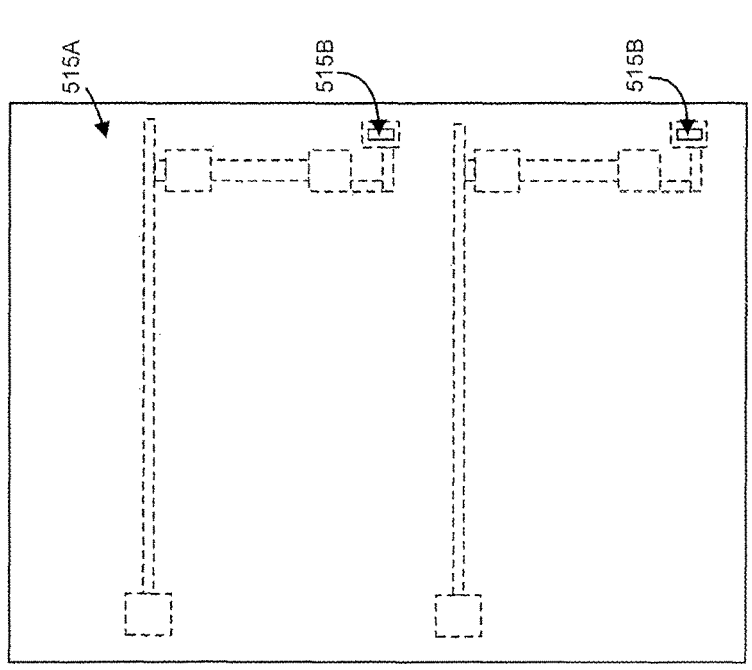

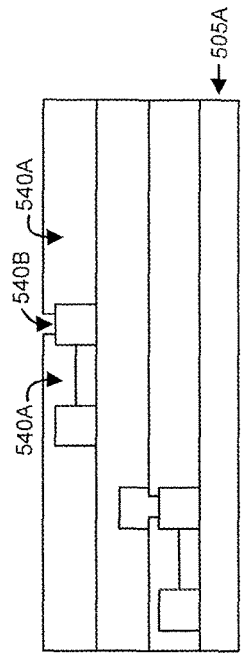
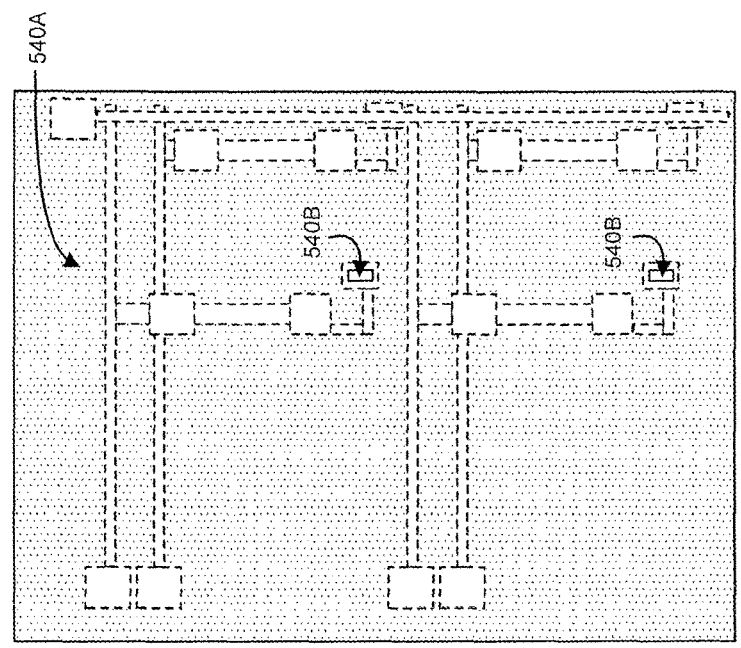
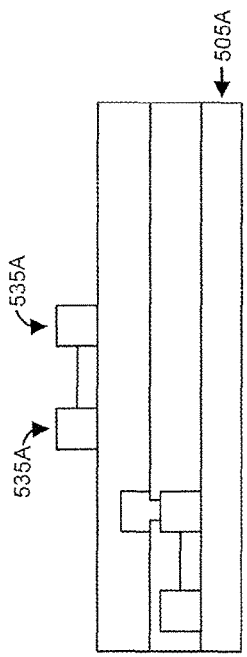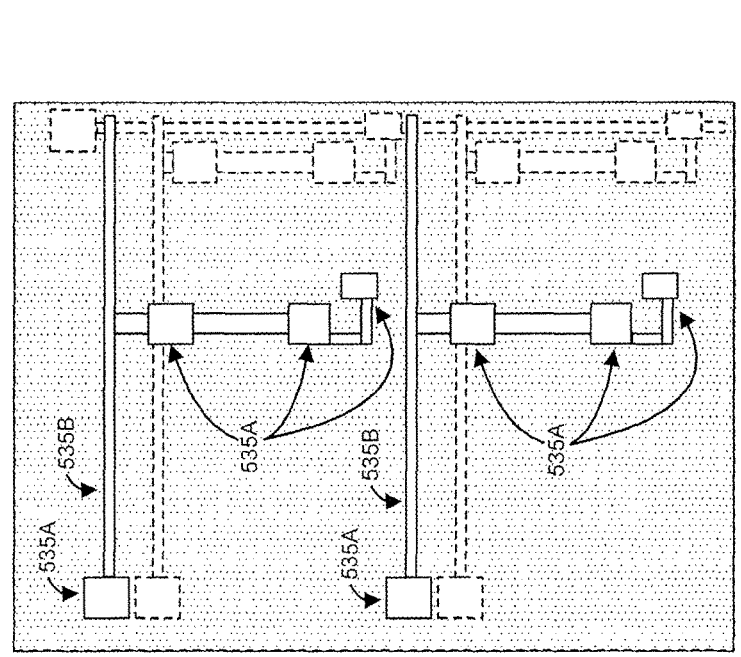

THREE-DIMENSIONAL INTEGRATED MULTISPECTRAL IMAGING SENSOR

BACKGROUND

Technical Field

The present invention relates generally to information processing and, in particular, to a three-dimensional (3D) integrated multispectral imaging sensor.

Description of the Related Art

Multispectral imaging is critical for many surveillance and diagnostic applications. The current state of the art for multispectral imaging involves a separate lens and filters for different detectors. However, such approach suffers from many deficiencies including, but not limited to, high cost, difficult manufacturing, required optical alignment for multiple channels, limited field of view, and increased weight which is not desirable for some if not most applications (e.g., space applications).

SUMMARY

According to an aspect of the present principles, a three-dimensional multispectral imaging sensor is provided. The three-dimensional multispectral imaging sensor includes a monolithic structure having a plurality of layers. Each of the layers is formed from light detecting materials for detecting light of respective different non-overlapping wavelengths and having respective different bandgaps.

According to another aspect of the present principles, a three-dimensional multispectral imaging sensor is provided. The three-dimensional multispectral imaging sensor includes a first layer formed from a first light detecting material for detecting light having a wavelength within a first range. The three-dimensional multispectral imaging sensor further includes a second layer, on the first layer, formed from a second light detecting material for detecting light having a wavelength within a second range. The three-dimensional multispectral imaging sensor also includes a third layer, on the second layer, formed from a third light detecting material for detecting light having a wavelength within a third range. The first range, the second range, and the third range are different and are non-overlapping.

According to yet another aspect of the present principles, a method for forming a three-dimensional multispectral imaging sensor is provided. The method includes forming a first layer from a first light detecting material for detecting light having a wavelength within a first range. The method further includes forming a second layer, on the first layer, from a second light detecting material for detecting light having a wavelength within a second range. The method also includes forming a third layer, on the second layer, from a third light detecting material for detecting light having a wavelength within a third range. The first range, the second range, and the third range are different and are non-overlapping.

These and other features and advantages will become apparent from the following detailed description of illustrative embodiments thereof, which is to be read in connection with the accompanying drawings.

BRIEF DESCRIPTION OF THE DRAWINGS

The disclosure will provide details in the following description of preferred embodiments with reference to the following figures wherein:

FIG. 8 shows a cross-sectional view of a 3D multispectral image sensor structure at step 315 of method 300, according to an embodiment of the present principles;

FIG. 9 shows a top view of a 3D multispectral image sensor structure at step 315 of method 300, in according to an embodiment if the present principles.

FIG. 10 shows a cross-sectional view of a 3D multispectral image sensor structure at step 320 of method 300, according to an embodiment of the present principles;

FIG. 11 shows a top view of a 3D multispectral image sensor structure at step 320 of method 300, in according to an embodiment if the present principles.

FIG. 16 shows a cross-sectional view of a 3D multispectral image sensor structure at step 335 of method 300, according to an embodiment of the present principles;

FIG. 17 shows a top view of a 3D multispectral image sensor structure at step 335 of method 300, in according to an embodiment if the present principles.

FIG. 18 shows a cross-sectional view of a 3D multispectral image sensor structure at step 340 of method 300, according to an embodiment of the present principles;

FIG. 19 shows as top view of a 3D multispectral image sensor structure at step 340 of method 300, in according to an embodiment if the present principles.

DETAILED DESCRIPTION

The present principles are directed to a three-dimensional (3D) integrated multispectral imaging sensor.

In an embodiment, the present principles provide different layers of materials deposited by a solution process.

Some of the many attendant advantages of the present principles include, but are not limited to, low cost, low weight, no required alignment for multiple channels, and a large field of view.

Figure 1:
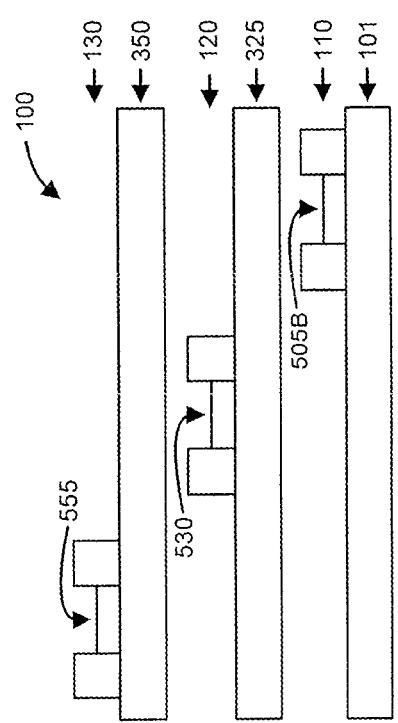
FIG. 1 shows an exploded cross-sectional view of a three-dimensional (3D) multispectral imaging sensor pixel 100, in accordance with an embodiment of the present principles.

FIG. 1 shows an exploded cross-sectional view of a three-dimensional (3D) multispectral imaging sensor pixel 100, in accordance with an embodiment of the present principles.

The pixel is formed across three different layers that, in turn, are formed on a substrate 101. The substrate 101 is formed of one or more of the following: glass; quartz; and Silicon (Si). Of course, other materials can be used in addition to, or in replacement of, one or more of the preceding substrate elements.

The three layers include a first layer 110, a second layer 120, and a third layer 130. The first layer 110 is formed on the substrate 101.

The first layer 110 is formed from Cadmium Sulfide (CdS) 505B. In an embodiment, the CdS 505b has a bandgap of 2.45 eV, for detecting (visible) light waves having a 200-600 nm wavelength.

The second layer 120 is formed from Lead(II) Sulfide (PbS) 530. In an embodiment, the PbS 530 has a bandgap of 0.37 eV, for detecting (near infrared) light waves having a 1000-3500 nm wavelength.

The third layer 130 is formed from Lead(II) Selenide (PbSe) 555. In an embodiment, the PbSe 555 has a bandgap of 0.27 eV, for detecting (mid-infrared) light waves having a 3500-500 nm wavelength.

An optically transparent interlayer dielectric 525 is deposited in between the first layer 110 and the second layer 120. An optically transparent interlayer dielectric 550 is deposited in between the second layer 120 and the third layer 130.

Figure 2:
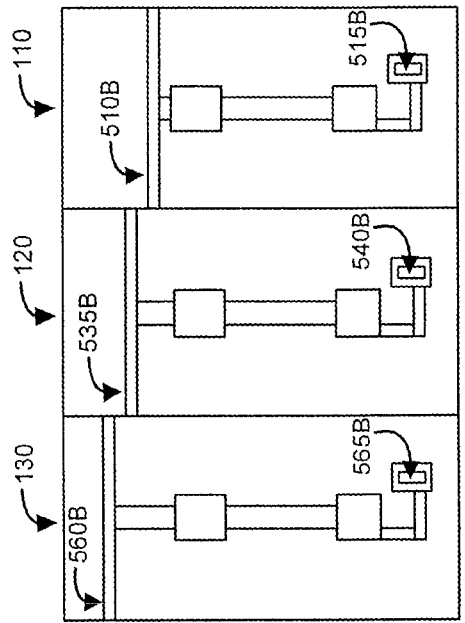
FIG. 2 shows a top view of the 3D multispectral imaging sensor pixel 100 of FIG. 1, in accordance with an embodiment of the present principles.

FIG. 2 shows a top view of the 3D multispectral imaging sensor pixel 100 of FIG. 1, in accordance with an embodiment of the present principles.

Figure 20:
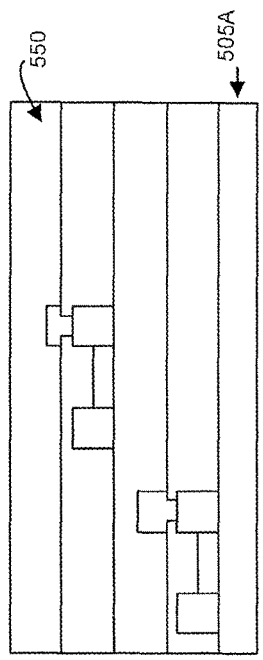
FIG. 20 shows a cross-sectional view of a 3D multispectral image sensor structure at step 345 of method 300, according to an embodiment of the present principles.
Figure 21:
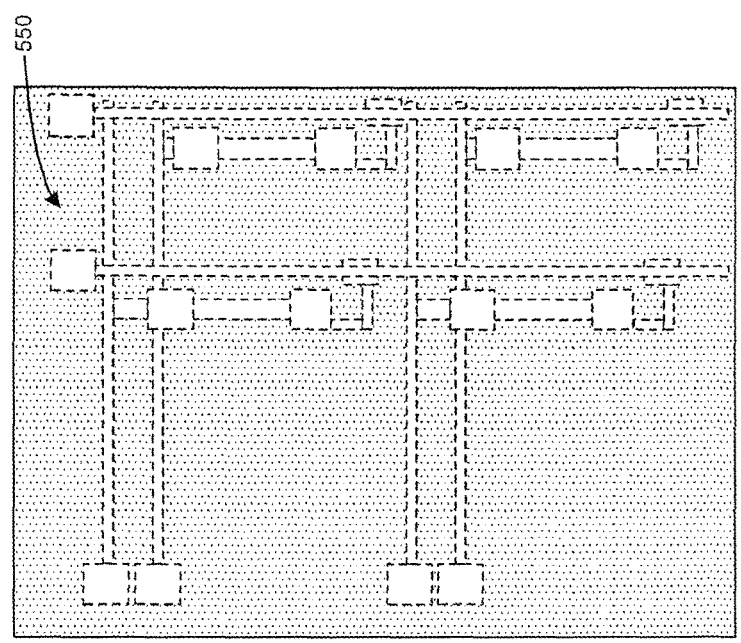
FIG. 21 shows a top view of a 3D multispectral image sensor structure at step 345 of method 300, in according to an embodiment if the present principles.
Figure 22:
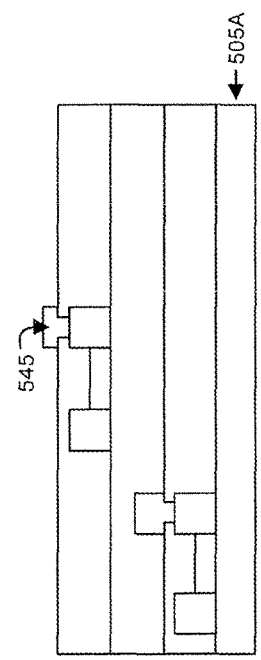
FIG. 22 shows a cross-sectional view of a 3D multispectral image sensor structure at step 350 of method 300, according to an embodiment of the present principles.
Figure 23:
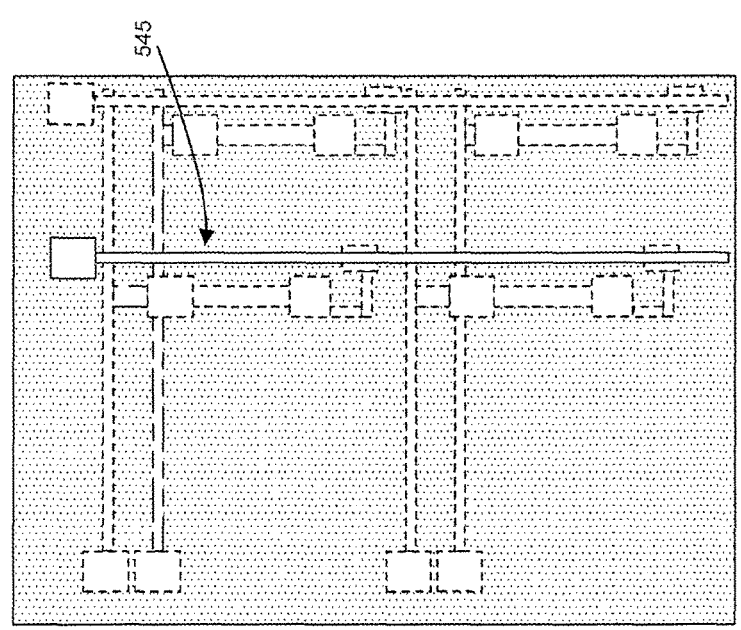
FIG. 23 shows a top view of a 3D multispectral image sensor structure at step 350 of method 300, in according to an embodiment if the present principles.
Figure 25:
FIG. 25 shows a top view of a 3D multispectral image sensor structure at step 355 of method 300, in according to an embodiment if the present principles.
Figure 24:
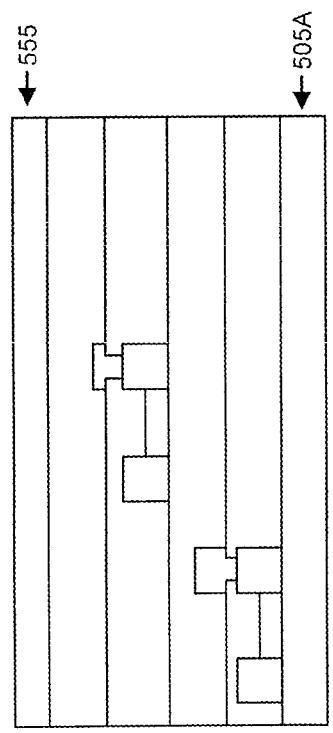
FIG. 24 shows a cross-sectional view of a 3D multispectral image sensor structure at step 355 of method 300, according to an embodiment of the present principles.
Figure 27:
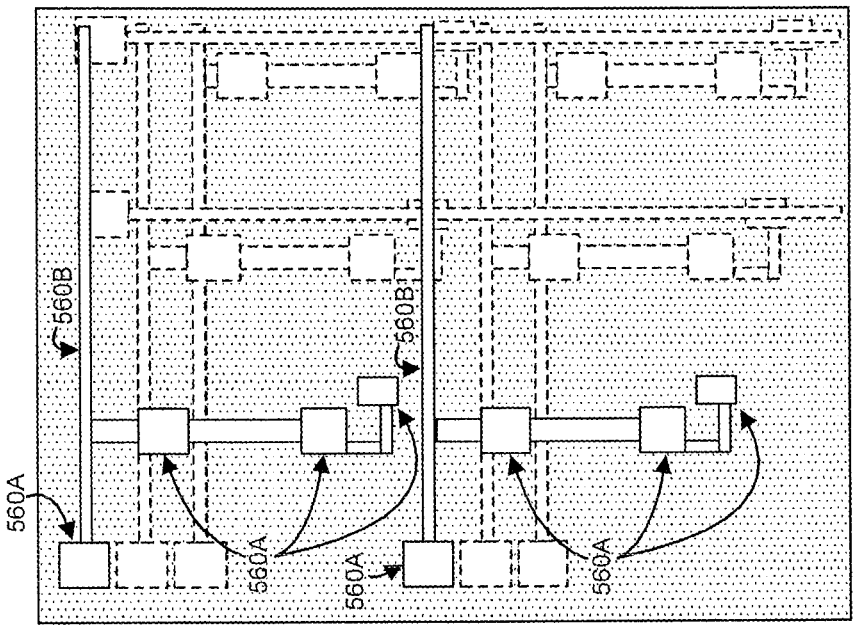
FIG. 27 shows a top view of a 3D multispectral image sensor structure at step 360 of method 300, in according to an embodiment if the present principles.
Figure 26:
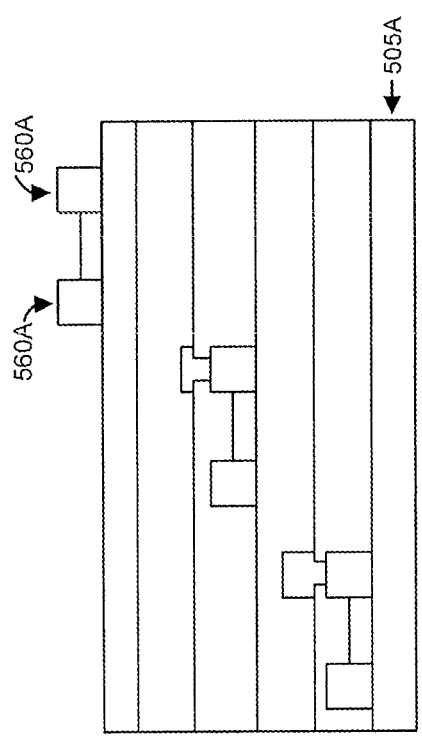
FIG. 26 shows a cross-sectional view of a 3D multispectral image sensor structure at step 360 of method 300, according to an embodiment of the present principles.
Figure 29:
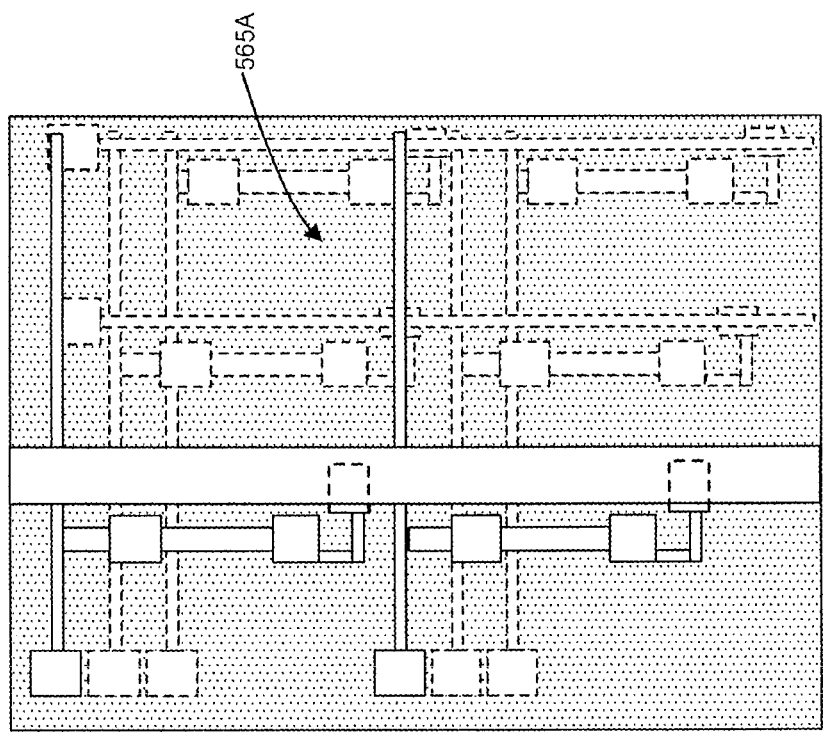
FIG. 29 shows a top view of a 3D multispectral image sensor structure at step 365 of method 300, in according to an embodiment if the present principles.
Figure 28:
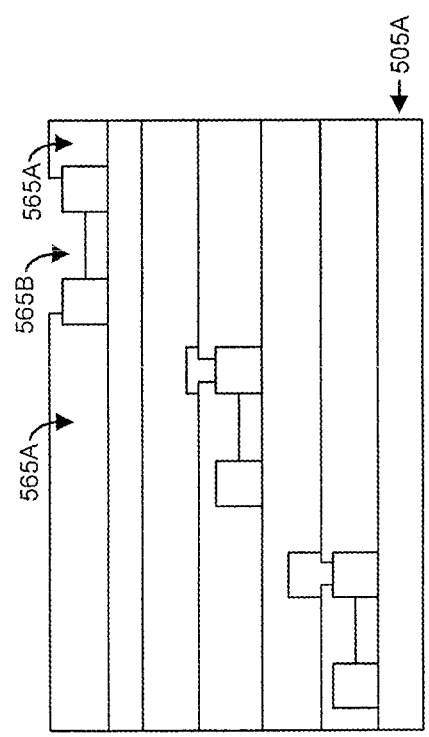
FIG. 28 shows a cross-sectional view of a 3D multispectral image sensor structure at step 365 of method 300, according to an embodiment of the present principles.
Figure 30:
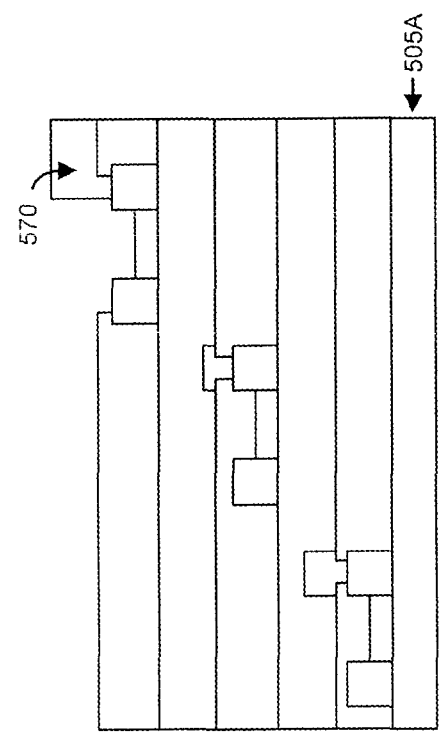
FIG. 30 shows a cross-sectional view of a 3D multispectral image sensor structure at step 370 of method 300, according to an embodiment of the present principles.

Each of the layers 110, 120, and 130 include respective word lines 510B, 535B, and 560B and bit lines (see FIGS. 10, 20, and 30). Moreover, each of the layers 110, 120, and 130 include vias (515B, 540B, 565B) for connecting the word lines and bit lines on one of the layers to word lines and bit lines on other ones of the layers. Typically, the word lines are implemented as rows, and the bit lines are implemented as columns.

Figure 3:
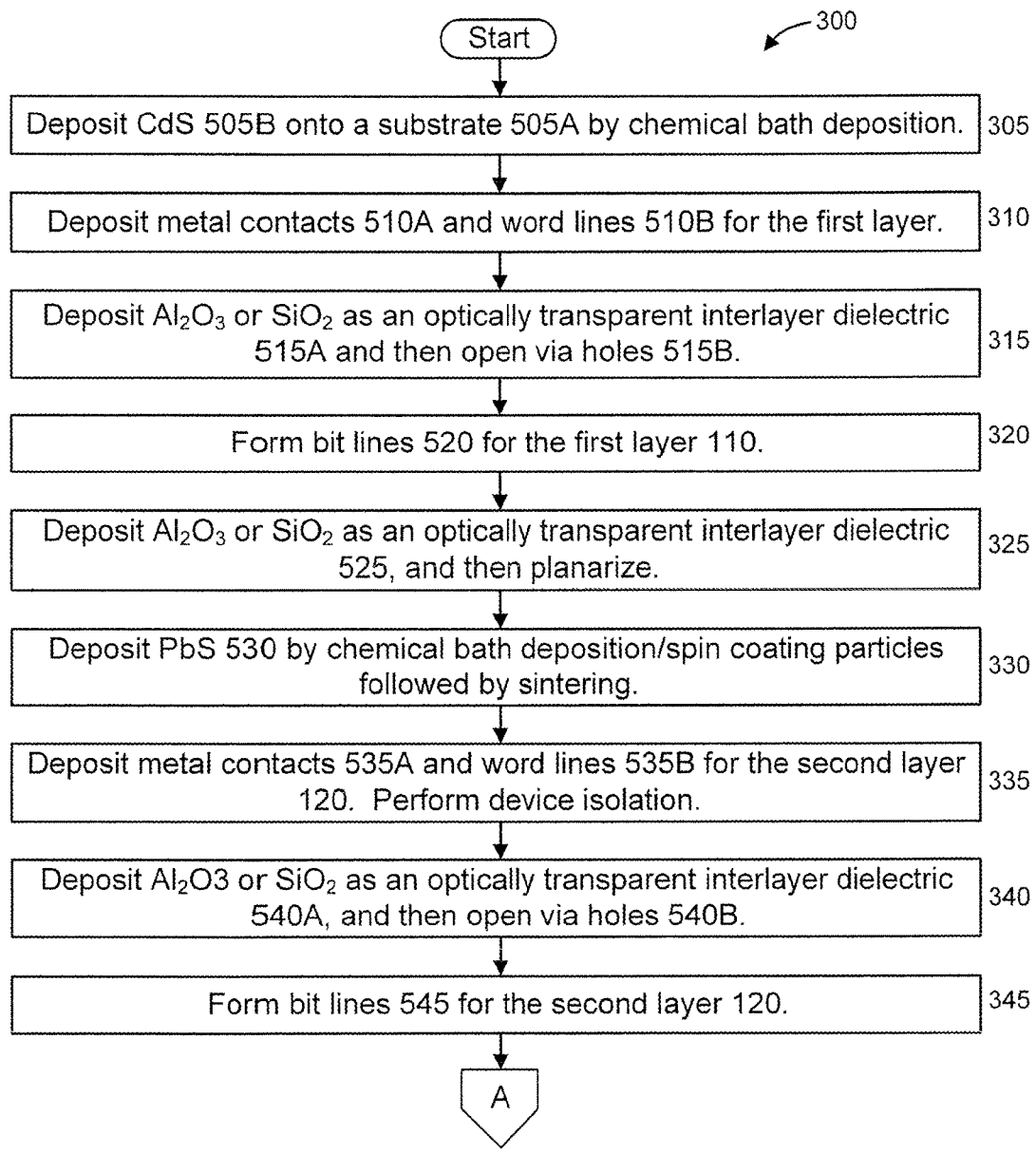
FIGS. 3-4 show an exemplary method 300 for forming a 3D multispectral imaging sensor, in accordance with an embodiment of the present principles.
Figure 4:
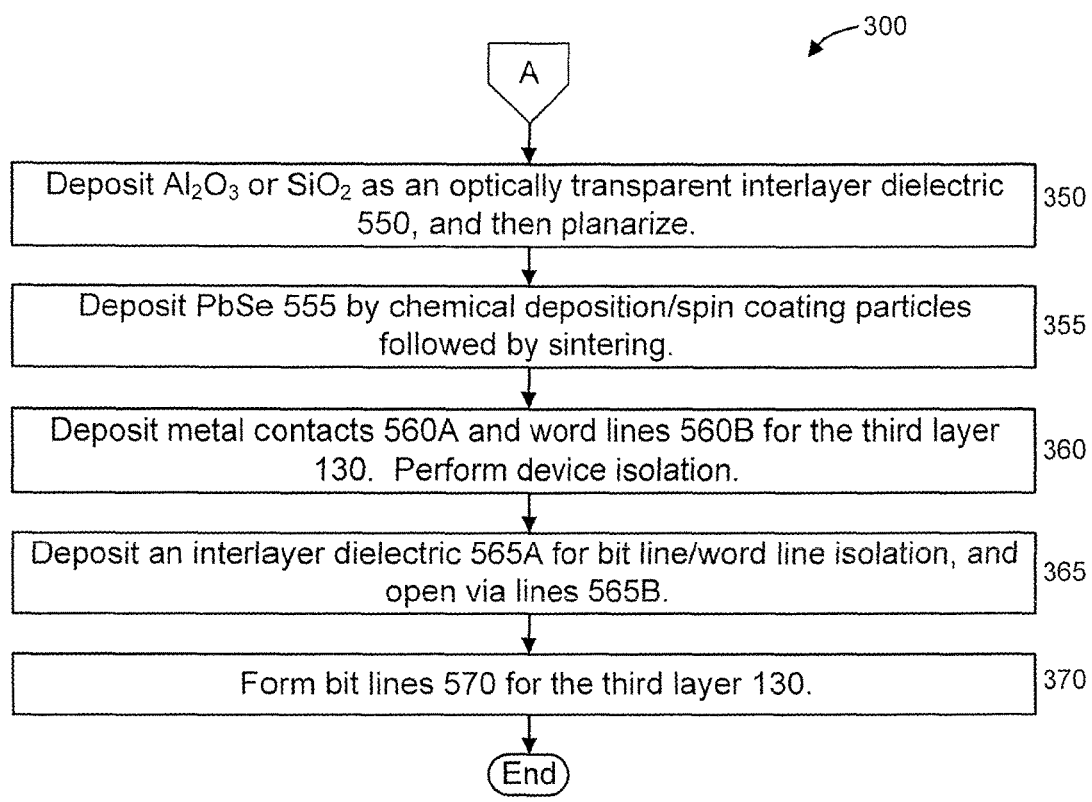
Figure 7:
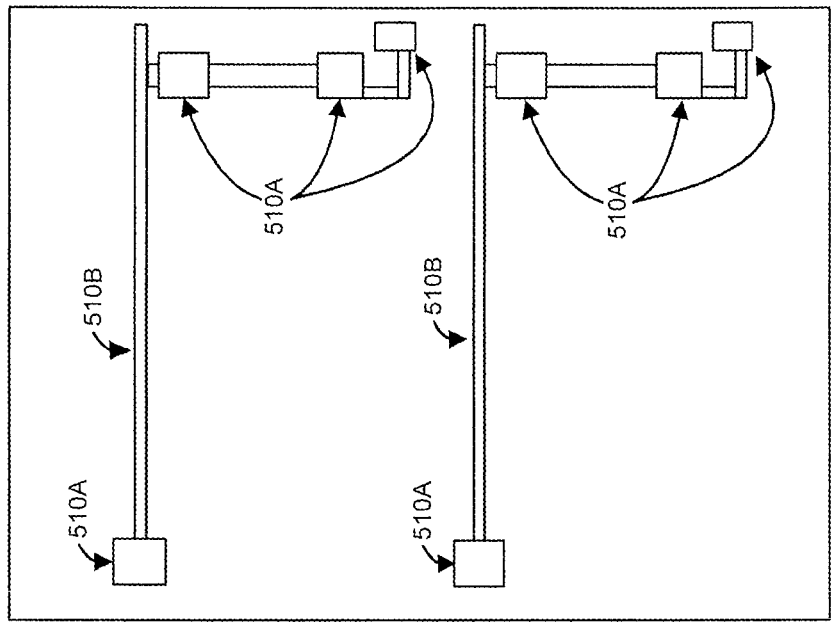
FIG. 7 shows a top view of a 3D multispectral image sensor structure at step 310 of method 300, in according to an embodiment if the present principles.
Figure 5:
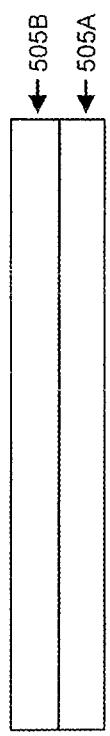
FIG. 5 shows a cross-sectional view of a 3D multispectral image sensor structure at step 305 of method 300, according to an embodiment of the present principles.
Figure 6:
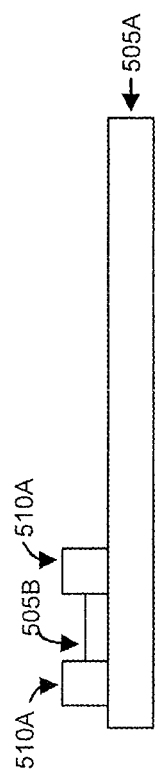
FIG. 6 shows a cross-sectional view of a 3D multispectral image sensor structure at step 310 of method 300, according to an embodiment of the present principles.
Figure 12:
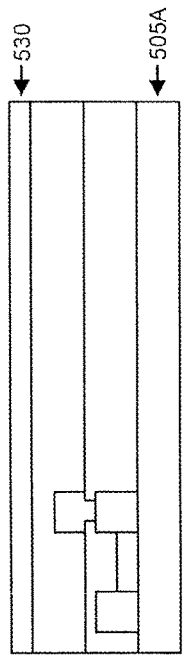
FIG. 12 shows a cross-sectional view of a 3D multispectral image sensor structure at step 325 of method 300, according to an embodiment of the present principles.
Figure 13:
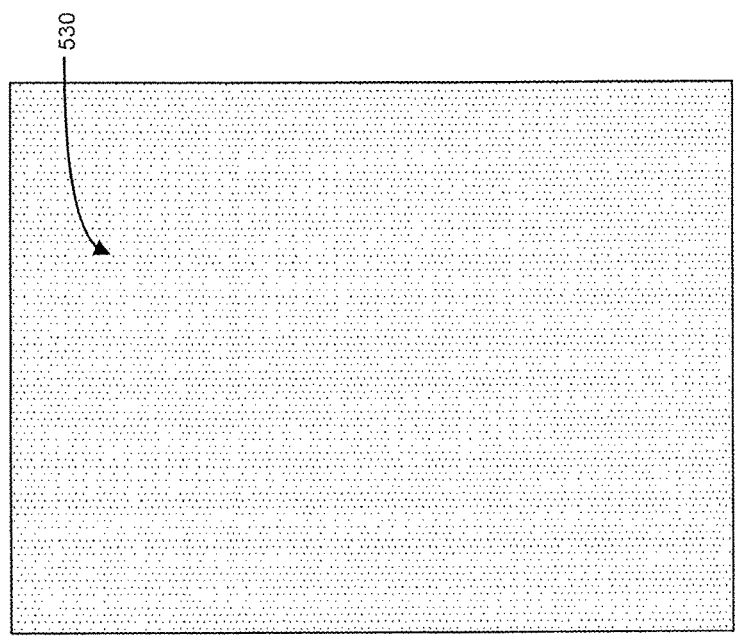
FIG. 13 shows a top view of a 3D multispectral image sensor structure at step 325 of method 300, in according to an embodiment if the present principles.
Figure 14:
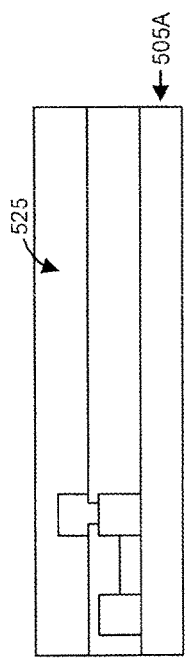
FIG. 14 shows a cross-sectional view of a 3D multispectral image sensor structure at step 330 of method 300, according to an embodiment of the present principles.
Figure 15:
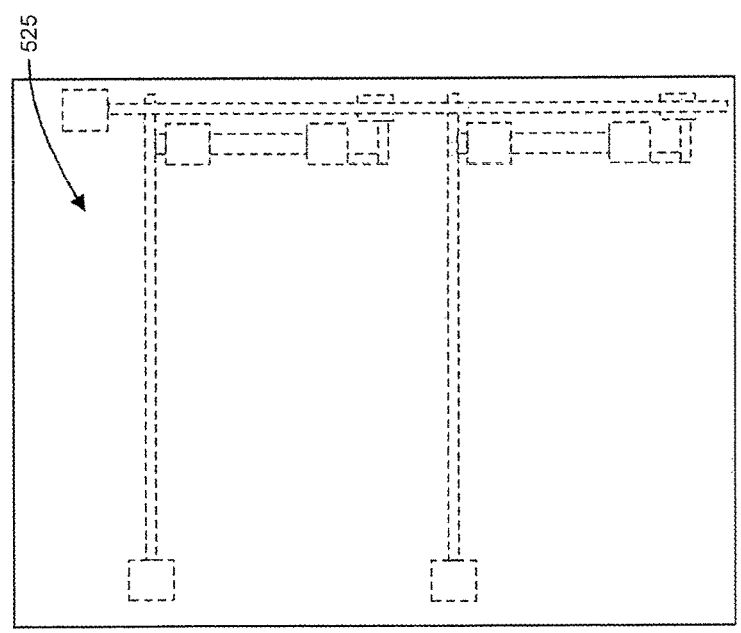
FIG. 15 shows a top view of a 3D multispectral image sensor structure at step 330 of method 300, in according to an embodiment if the present principles.

FIGS. 3-4 show an exemplary method 300 for forming a 3D multispectral imaging sensor, in accordance with an embodiment of the present principles.

FIGS. 5, 6, 8, 10, 12, 14, 16, 18, 20, 22, 24, 26, 28, and 30 show various cross-sectional views of a 3D multispectral image sensor structure at various steps in method 300, according to an embodiment of the present principles.

FIGS. 7, 9, 11, 13, 15, 17, 19, 21, 23, 25, 27, 29, and 31 show various top views of a 3D multispectral image sensor structure at various steps in method 300, in according to an embodiment if the present principles.

Figure 31:
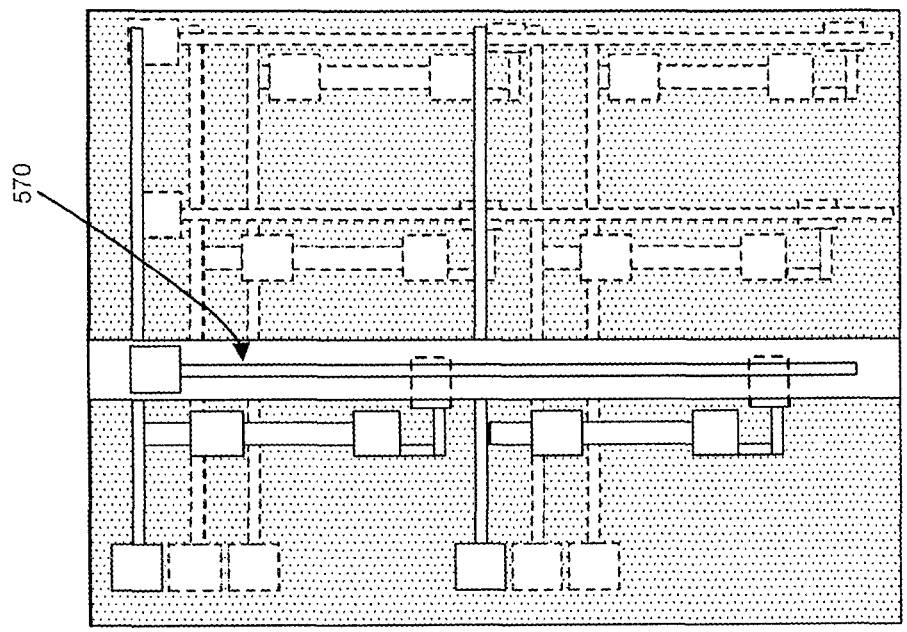
FIG. 31 shows a top view of a 3D multispectral image sensor structure at step 370 of method 300, in according to an embodiment if the present principles.

At least the following correlations apply: step 305 (FIG. 5); step 310 (FIGS. 6-7); step 315 (FIGS. 8-9); step 320 (FIGS. 10-11); step 325 (FIGS. 12-13); step 330 (FIGS. 14-15); step 335 (FIGS. 16-17); step 340 (FIGS. 18-19); step 345 (FIGS. 20-21); step 350 (FIGS. 22-23); step 355 (FIGS. 24-25); step 360 (FIGS. 26-27); step 365 (FIGS. 28-29); and step 370 (FIGS. 30-31).

At step 305, deposit CdS 505B onto a substrate 505A by chemical bath deposition. In an embodiment, the CdS 505B has a bandgap of 2.45 eV, for detecting (visible) light waves having a 200-600 nm wavelength. However, in other embodiments, other bandgaps can be used depending upon the specific application. In an embodiment, the substrate 405A includes one or more of glass, quartz, and Silicon. Of course, other materials can be used in addition to, or in replacement of, one or more of the preceding substrate elements.

At step 310, deposit metal contacts 510A and word lines 510B for the first layer 110. Perform device isolation (e.g., with either wet (HCl) or dry ($CH_4/H_2/Ar$) etch).

At step 315, deposit $Al_2O_3$ or $SiO_2$ as an optically transparent interlayer dielectric 515A and then open via holes 515B.

At step 320, form bit lines 520 for the first layer.

At step 325, deposit $Al_2O_3$ or $SiO_2$ as an optically transparent interlayer dielectric 525, and then planarize.

At step 330, deposit PbS 530 by chemical bath deposition/spin coating particles followed by sintering. In an embodiment, the PbS 530 has a bandgap of 0.37 eV, for detecting (near infrared) light waves having a 1000-3500 nm wavelength. However, in other embodiments, other bandgaps can be used depending upon the specific application.

At step 335, deposit metal contacts 535A and word lines 535B for the second layer 120. Perform device isolation (e.g., with either wet (HCl) or dry ($CH_4/H_2/Ar$) etch).

At step 340, deposit $Al_2O_3$ or $SiO_2$ as an optically transparent interlayer dielectric 540A, and then open via holes 540B.

At step 345, form bit lines 545 for the second layer 120.

At step 350, deposit $Al_2O_3$ or $SiO_2$ as an optically transparent interlayer dielectric 550, and then planarize.

At step 355, deposit PbSe 555 by chemical deposition/spin coating particles followed by sintering. In an embodiment, the PbSe 555 has a bandgap of 0.27 eV, for detecting (mid-infrared) light waves having a 3500-500 nm wavelength. However, in other embodiments, other bandgaps can be used depending upon the specific application.

At step 360, deposit metal contacts 560A and word lines 560B for the third layer 130. Perform device isolation (e.g., with either wet (HCl) or dry ($CH_4/H_2/Ar$) etch).

At step 365, deposit an interlayer dielectric 565A for bit line/word line isolation, and open via lines 565B.

At step 370, form bit lines 570 for the third layer 130.

Some of the steps of method 300 mention and/or otherwise implicate the use of material deposition techniques. The present principles are not limited to any particular material deposition techniques and, thus, any known as well as yet to be discovered material deposition technique(s) can be used in accordance with the teachings of the present principles, while maintaining the spirit of the present principles.

Thus, any of the following material deposition techniques, as well as others, can be used to implement the present principles: Hydrazine-based molecular precursor; nanomaterials precursor; metal-organic precursor; and chemical bath deposition.

Moreover, while the three layers 110, 120, and 130 described herein are formed using CdS, PbS, and PbSe, respectively, in other embodiments, other materials can be used while maintaining the spirit of the present principles. Also, in other embodiments, the materials CdS, PbS, and PbSe can be rearranged such that CdS is used on the third layer 130, and PbSe is used on the first layer 110. Other arrangements are also possible. Also, different bandgaps can be used, as well as different bandgap ranges (e.g., non-overlapping ranges). These and other variations of the present principles are readily determined by one of ordinary skill in the art given the teachings of the present principles provided herein, while maintaining the spirit of the present principles.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A three-dimensional multispectral imaging sensor, comprising:
a monolithic structure having at least three layers, each of the layers being formed from light detecting materials for detecting light of respective different non-overlapping wavelengths and having respective different bandgaps, the light detecting materials in each of the layers being staggered and non-overlapping with respect to each other.

2. The three-dimensional multispectral imaging sensor of claim 1, further comprising address lines, and wherein the light detecting materials in each of the layers form a respective light detector that is separately addressed by the address lines.

3. A three-dimensional multispectral imaging sensor, comprising:
a first layer formed from a first light detecting material for detecting light having a wavelength within a first range;
a second layer, on the first layer, formed from a second light detecting material for detecting light having a wavelength within a second range; and
a third layer, on the second layer, formed from a third light detecting material for detecting light having a wavelength within a third range,
wherein the first range, the second range, and the third range are different, and the light detecting materials in each of the layers are staggered and non-overlapping with respect to each other.

4. The three-dimensional multispectral imaging sensor of claim 3, where portions of the light detecting materials in each of the layers are staggered with respect to each other to form a respective pixel.

5. The three-dimensional multispectral imaging sensor of claim 3, wherein a three-dimensional multispectral pixel of the three-dimensional multispectral imaging sensor is formed from at least a portion of the light detecting materials on each of the first, second, and third layers.

6. The three-dimensional multispectral imaging sensor of claim 3, wherein the first range corresponds to visible light, the second range corresponds to near infrared light, and the third range corresponds to mid-infrared light.

7. The three-dimensional multispectral imaging sensor of claim 3, wherein the first layer is formed on a substrate.

8. The three-dimensional multispectral imaging sensor of claim 3, wherein the substrate comprises at least one of glass, quartz, and Silicon.

9. The three-dimensional multispectral imaging sensor of claim 3, further comprising a respective optically transparent interlayer dielectric layer disposed between the first and second layers and between the second and third layers.

10. The three-dimensional multispectral imaging sensor of claim 3, further comprising address lines, and wherein the light detecting materials in each of the layers form a respective light detector that is separately addressed by the address lines.

11. The three-dimensional multispectral imaging sensor of claim 3, wherein the first light detecting material, the second light detecting material, and the third light detecting material having different bandgaps.

12. The three-dimensional multispectral imaging sensor of claim 11, wherein the first light detecting material has a bandgap within a first range, the second light detecting material has a bandgap within a second range, and the third light detecting material has a bandgap within a third range, wherein the ranges are non-overlapping with respect to each other.

13. The three-dimensional multispectral imaging sensor of claim 3, wherein the first light detecting material, the second light detecting material, and third light detecting material form a three-dimensional monolithic structure.

14. The three-dimensional multispectral imaging sensor of claim 13, wherein the first light detecting material is Cadmium Sulfide, the second light detecting material is Lead(II) Sulfide, and the third light detecting material is Lead(II) Selenide.

15. The three-dimensional multispectral imaging sensor of claim 3, wherein
the first layer comprises a first plurality of discrete light detectors for detecting the light having the wavelength within the first range,
the second layer comprises a second plurality of discrete light detectors for detecting the light having the wavelength within the second range, and
the third layer comprises a third plurality of discrete light detectors for detecting the light having the wavelength within the third range.

16. A method for forming a three-dimensional multispectral imaging sensor, comprising:
forming a first layer from a first light detecting material for detecting light having a wavelength within a first range;
forming a second layer, on the first layer, from a second light detecting material for detecting light having a wavelength within a second range; and
forming a third layer, on the second layer, from a third light detecting material for detecting light having a wavelength within a third range,
wherein the first range, the second range, and the third range are different, and the light detecting materials in each of the layers are staggered and non-overlapping with respect to each other.

17. The method of claim 16, where the light detecting materials in each layer that form a respective pixel are staggered with respect to each other.

18. The method of claim 16, wherein the first layer, the second layer, and the third layer are formed as a three-dimensional monolithic structure.

19. The method of claim 16, wherein
forming the first layer comprises forming a first plurality of discrete light detectors for detecting the light having the wavelength within the first range,
forming the second layer comprises forming a second plurality of discrete light detectors for detecting the light having the wavelength within the second range, and
forming the third layer comprises forming a third plurality of discrete light detectors for detecting the light having the wavelength within the third range.

* * * * *